(12) United States Patent
Chu

(10) Patent No.: US 7,619,940 B2
(45) Date of Patent: Nov. 17, 2009

(54) APPARATUS AND METHOD OF GENERATING POWER UP SIGNAL OF SEMICONDUCTOR INTEGRATED CIRCUIT

(75) Inventor: Gyo-Soo Chu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 137 days.

(21) Appl. No.: 11/647,479

(22) Filed: Dec. 29, 2006

(65) Prior Publication Data

US 2007/0297261 A1    Dec. 27, 2007

(30) Foreign Application Priority Data

Jun. 27, 2006  (KR)  .................... 10-2006-0057830

(51) Int. Cl.
*G11C 7/04* (2006.01)
*G11C 5/14* (2006.01)
*G11C 7/00* (2006.01)
*G05F 1/10* (2006.01)

(52) U.S. Cl. .................. 365/211; 365/226; 365/189.09; 365/189.11; 327/530; 327/535

(58) Field of Classification Search ................. 365/211, 365/226, 189.09, 189.11; 331/176; 327/530, 327/535
See application file for complete search history.

(56) References Cited

U.S. PATENT DOCUMENTS

| 5,440,520 | A  | * | 8/1995 | Schutz et al. | ............... | 365/211 |
|---|---|---|---|---|---|---|
| 5,801,596 | A  | * | 9/1998 | Sakurai | ....................... | 331/176 |
| 6,453,218 | B1 | * | 9/2002 | Vergis | ......................... | 365/211 |
| 6,801,454 | B2 | * | 10/2004 | Wang et al. | .................. | 365/211 |
| 6,809,978 | B2 | * | 10/2004 | Alexander et al. | .......... | 365/211 |
| 7,106,112 | B2 |   | 9/2006 | Jang | | |
| 7,266,031 | B2 | * | 9/2007 | Kim et al. | .................... | 365/211 |
| 7,272,063 | B1 | * | 9/2007 | Egerer et al. | ................. | 365/211 |
| 7,315,476 | B2 | * | 1/2008 | Choi | .......................... | 365/211 |
| 2006/0145739 | A1 |  | 7/2006 | Kim | | |

FOREIGN PATENT DOCUMENTS

| KR | 1020020056262 | 7/2002 |
|---|---|---|
| KR | 1020030058272 | 7/2003 |
| KR | 1020040035065 | 4/2004 |
| KR | 1020040103654 A | 12/2004 |
| KR | 1020050041595 | 5/2005 |
| KR | 10-0557539 | 2/2006 |
| KR | 1020060075946 | 7/2006 |

* cited by examiner

*Primary Examiner*—Trong Phan
(74) *Attorney, Agent, or Firm*—Venable LLP; Jeffri A. Kaminski

(57) ABSTRACT

An apparatus for generating a power up signal for a semiconductor memory chip includes a temperature information providing unit that outputs a control voltage corresponding to predetermined temperature information. A power up signal generating unit generates the power up signal based at least on one of an external voltage or the control voltage.

8 Claims, 4 Drawing Sheets

US 7,619,940 B2

APPARATUS AND METHOD OF GENERATING POWER UP SIGNAL OF SEMICONDUCTOR INTEGRATED CIRCUIT

BACKGROUND

The present invention relates to a semiconductor integrated circuit, and in particular, to an apparatus and method of generating a power up signal of a semiconductor memory.

Typically, the power up signal is enabled according to whether a level of power supplied to a semiconductor integrated circuit is stabilized to a predetermined level or more.

When an initial operation, in which power starts to be supplied, is performed, the power up signal is kept in a disable state (for example, in a low level) and internal information of the memory is initialized, that is, reset.

Then, if the power up signal is enabled (for example, in a high level), an active operation is prepared after a predetermined time passes (for example, 100 us) such that the semiconductor memory can normally operate.

Further, a fast power up phenomenon occurs when a power up sequence is rapidly executed, during which the semiconductor integrated circuit enters a deep power down mode in which power is rapidly cut off according to an external command and then rapidly returns to a normal mode, or when the level of power rapidly changes due to noise.

As shown in FIG. 1, a conventional power up signal generating apparatus includes resistors R1 and R2, an inverter IV1, and first, second and third transistors M1, M2, M3.

The resistors R1 and R2 are connected between a power terminal VDDI and a ground terminal. The first transistor M1 has a source connected to the power terminal VDDI and a gate connected to the ground terminal. The second transistor M2 has a drain connected to a drain of the first transistor M1, a source connected to the ground terminal, and a gate connected to a connection node A of the resistors R1 and R2. The inverter IV1 has an input terminal connected to a connection node B of the first transistor M1 and the second transistor M2, to output a power up signal PWRUP. The third transistor M3 has a drain connected to the power terminal VDDI and a gate and a source connected to the connection node A of the resistors R1 and R2.

In the conventional power up signal generating apparatus, a current flows into the node B through the first transistor M1 such that the inverter IV1 disables the power up signal PWRUP in a low level, until the level of the node A becomes equal to or more than a threshold voltage of the second transistor M2.

When the level of the node A becomes equal to or more than the threshold voltage of the second transistor M2, the current supplied through the first transistor M1 is discharged to the ground terminal through the second transistor M2 such that the level of the node B becomes a low level. Then, the inverter IV1 enables the power up signal PWRUP in a high level.

The level of the power up signal PWRUP is determined according to the amount of a current that flows through the first transistor M1 and the amount of a current that is discharged to the ground terminal through the second transistor M2.

As shown in FIG. 2, in the conventional power up signal generating apparatus, even though a predetermined period of the power up signal PWRUP is disabled in a low level at the beginning of the operation, if the level of the node A rises equal to or more than a predetermined level, the power up signal PWRUP is enabled in a high level.

As a period C of FIG. 2, when the fast power up phenomenon occurs, in which power rapidly drops and then rises at a 1us slope, in a case where a temperature at that time is high (HOT, for example, 90° C.), enough current is supplied by the first transistor M1 of FIG. 1. Thus, the level of the node B in the period C of FIG. 2 rises to a level at which a logical value is determined as 'high'. Therefore, the power up signal PWRUP is disabled in a low level and then enabled in a high level after a predetermined time.

However, in a case where a temperature at that time is low (COLD, for example, 40° C.), since enough current is not supplied by the first transistor M1 of FIG. 1, the level of the node B in the period C of FIG. 2 cannot rise to the level at which the logical value is determined as 'high'. Therefore, the power up signal PWRUP is not disabled in the low level and thus a power up fail phenomenon when the power up signal PWRUP keeps a high level occurs.

As described above, the conventional power up signal generating apparatus has a problem in that, when the fast power up phenomenon occurs in a state where the operation temperature is low, an error occurs in generating the power up signal. The initial operation for memory information cannot be performed, which makes it difficult to perform the normal operation of the semiconductor memory.

SUMMARY

According to one exemplary embodiment, provides an apparatus and method of generating a power up signal of a semiconductor integrated circuit such that a normal power up signal is allowed to be generated, regardless of a temperature condition, is provided.

According to another exemplary embodiment, an apparatus for generating a power up signal of a semiconductor memory includes a temperature information providing unit that outputs a control voltage corresponding to predetermined temperature information, and a power up signal generating unit that generates a power up signal according to at least one of an external voltage and the control voltage.

According to another exemplary embodiment, an apparatus for generating a power up signal of a semiconductor memory includes a voltage level converting unit that converts the level of a voltage of a power terminal at a predetermined ratio and outputs the converted voltage level, a detecting unit that detects whether or not the output level of the voltage level converting unit is equal to or more than a set level and generates the power up signal, and a correcting unit that corrects the level of the power up signal according to predetermined temperature information.

According to still another exemplary embodiment, a method of generating a power up signal of a semiconductor memory includes receiving predetermined temperature information, converting the input temperature information into an analog voltage, and correcting the level of the power up signal according to the analog voltage and outputting the corrected power up signal.

According to yet still another exemplary embodiment, a method of generating a power up signal of a semiconductor memory includes receiving predetermined temperature information, and correcting the level of the power up signal according to the input temperature information and outputting the corrected power up signal.

DESCRIPTION OF EXEMPLARY EMBODIMENTS

Hereinafter, exemplary embodiments of the present invention will be described in detail with reference to the accompanying drawings.

Figure 1:
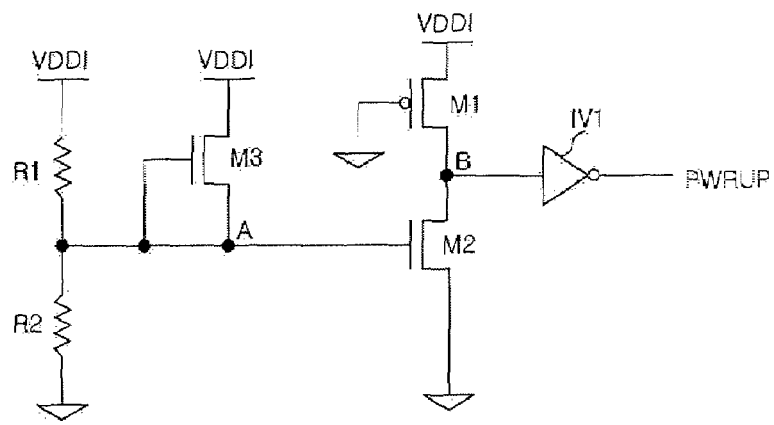
FIG. 1 is a circuit diagram showing a structure of a conventional apparatus for generating a power up signal of a semiconductor integrated circuit.
Figure 2:
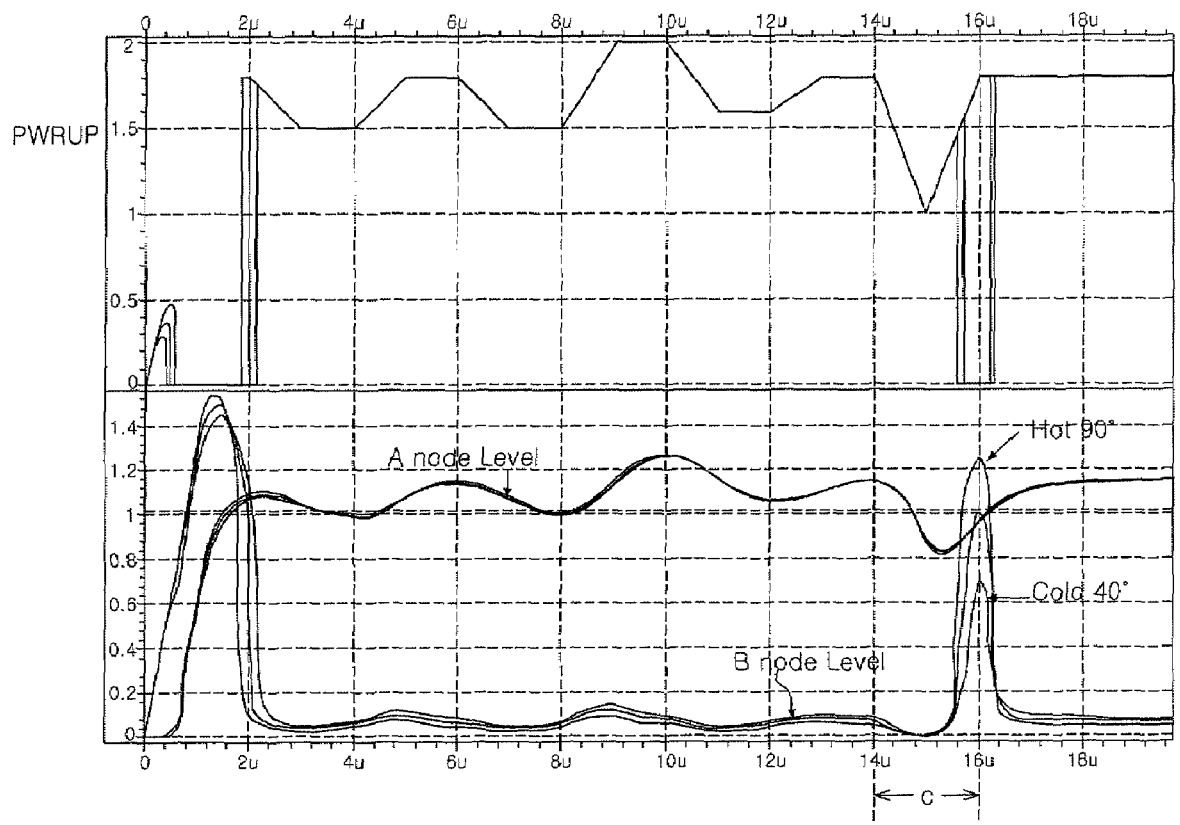
FIG. 2 is a waveform view showing output waveforms of individual parts of the conventional apparatus for generating a power up signal of a semiconductor integrated circuit.
Figure 3:
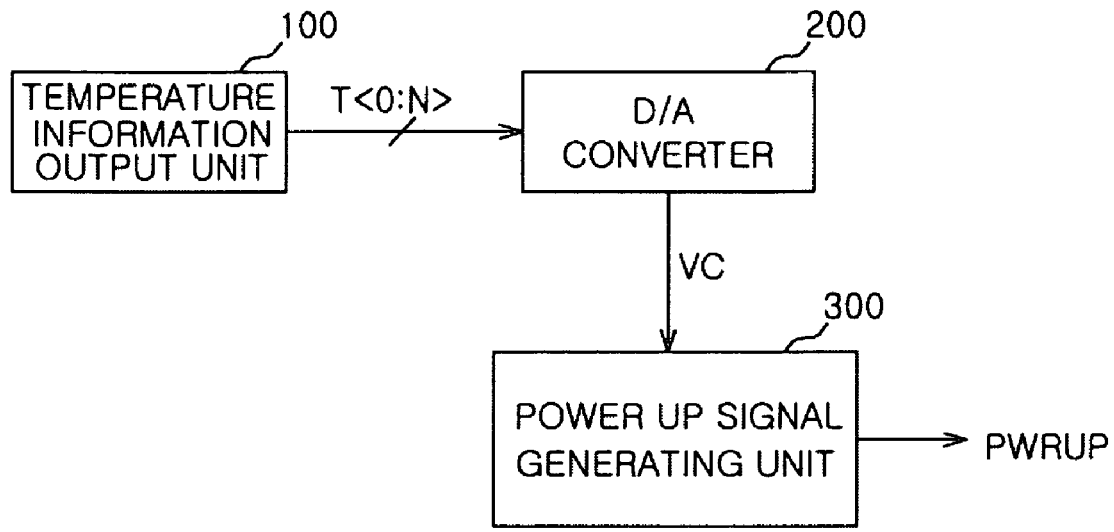
FIG. 3 is a block diagram showing of an exemplary structure of an apparatus for generating a power up signal of a semiconductor integrated circuit according to an exemplary embodiment.

As shown in FIG. 3, an apparatus for generating a power up signal of a semiconductor integrated circuit according to an exemplary embodiment includes a temperature information output unit 100, a digital-to-analog converting unit or D/A converter 200, and a power up signal generating unit 300.

The temperature information output unit 100 detects a temperature outside of the semiconductor integrated circuit, to output temperature information T<0:N>. The temperature information T<0:N> may have at least two bits. At that time, if the number of bits is larger, intervals of the temperature can be subdivided.

The temperature information output unit 100 may be incorporated in a semiconductor memory chip or may be provided outside the semiconductor memory chip. In order to provide stable temperature information, in one embodiment, the temperature information output unit 100 is provided outside the semiconductor memory chip.

The digital-to-analog converting unit 200 converts the temperature information T<0:N> into an analog control voltage VC.

The power up signal generating unit 300 generates a power up signal PWRUP according to at least one of an external power supply voltage VDDI and the analog control voltage VC.

Figure 4:
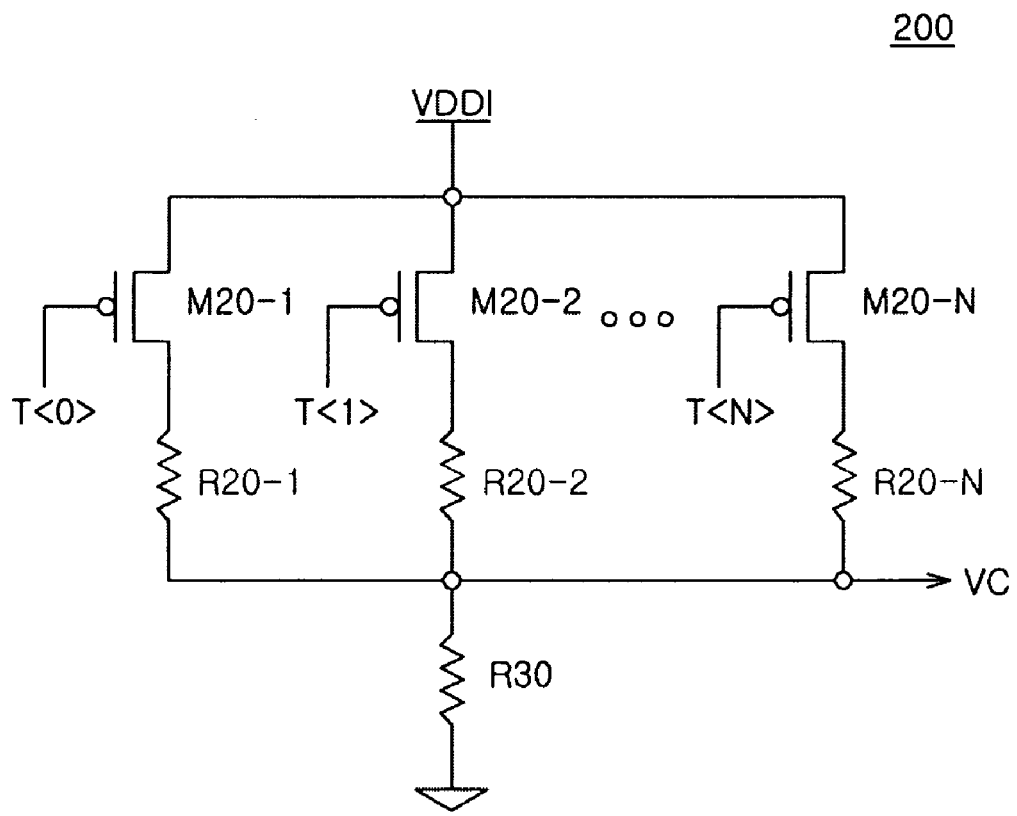
FIG. 4 is a circuit diagram showing the structure of a D/A converting unit of FIG. 3.

Referring to FIG. 4, the D/A converter 200 includes a plurality of transistors M20-1, M20-2, ..., M20-N, a plurality of first resistors R20-1, R20-2, ..., R20-N, and a second resistor R30.

The transistors M20-1, M20-2, ..., M20-N include sources connected to a power terminal VDDI and gates that receive the temperature information T<0:N>. The plurality of first resistors R20-1, R20-2, ..., R20-N include first ends correspondingly connected to the drains of the plurality of transistors M20-1, M20-2, ..., M20-N. The second resistor R30 include a first end commonly connected to second ends of the plurality of first resistors R20-1, R20-2, ..., R20-N, and a second end connected to a ground terminal. The analog control voltage VC is output from a connection node between the plurality of first resistors R20-1, R20-2, ..., and R20-N and the second resistor R30.

If the temperature defined by the temperature information T<0:N> is low, the D/A converter 200 increases an output level of the analog control voltage VC. For example, each first resistor R20-1, R20-2, ..., and R20-N of the D/A converter 200 has a different resistance value. When the resistance values of the first resistors are small, the level of the control voltage VC rises accordingly to the voltage division principle. Therefore, when the temperature defined by the temperature information T<0:N> is low, a resistor having a small resistance value is selected among the plurality of the first resistors R20-1, R20-2, ..., and R20-N.

Figure 5:
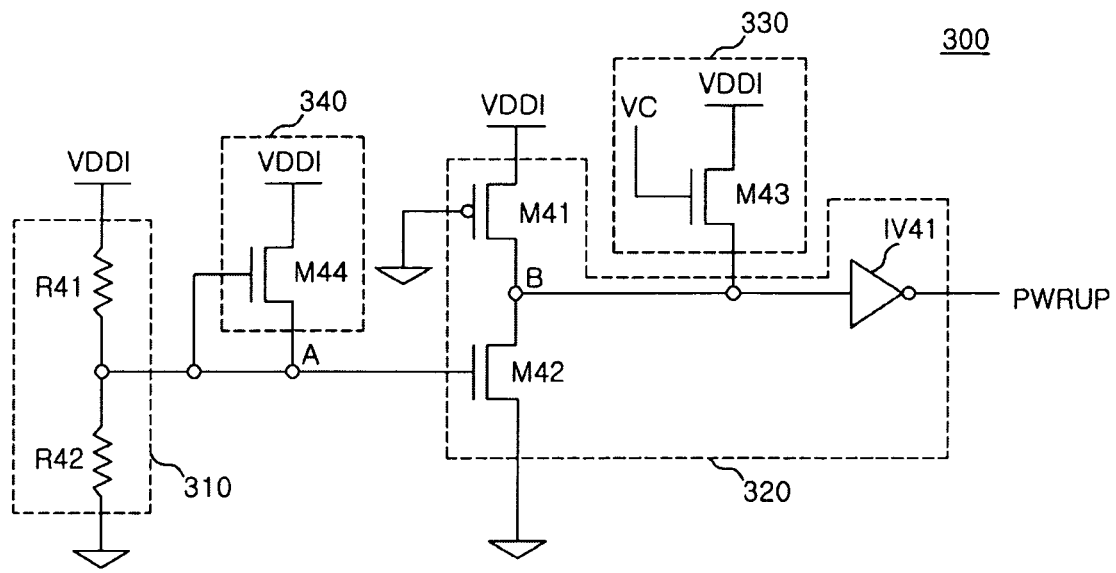
FIG. 5 is a circuit diagram showing the structure of a power up signal generating unit of FIG. 3.

As shown in FIG. 5, the power up signal generating unit 300 includes a voltage level converting unit 310, a detecting unit 320, a correcting unit 330, and an overvoltage preventing unit 340.

The voltage level converting unit 310 converts and outputs a voltage level of the power terminal VDDI at a predetermined ratio. The voltage level converting unit 310 includes a plurality of resistors R41 and R42 connected in series between the power terminal VDDI and the ground terminal.

The detecting unit 320 detects whether the voltage output level of the voltage level converting unit 310 is equal to or more than a set level, to generate the power up signal PWRUP using the detected result. The detecting unit 320 includes a first transistor M41 that has a source connected to the power terminal VDDI and a gate connected to the ground terminal, a second transistor M42 that has a drain connected to a drain of the first transistor M41, a source connected to the ground terminal, and a gate which receives the output of the voltage level converting unit 310. An inverter IV41 has an input terminal connected to the drain of the second transistor M42.

The correcting unit 330 corrects the level of the power up signal PWRUP according to the analog control voltage VC. The correcting unit 330 includes a third transistor that has a source connected to the power terminal VVDI, a gate which receives the analog control voltage VC, and a drain connected to the input terminal of the inverter IV41 of the detecting unit 320.

The overvoltage preventing unit 340 prevents an overvoltage from being applied through the voltage level converting unit 310. The overvoltage preventing unit 340 includes a fourth MOS transistor M44 having a diode structure, connected between the power terminal VDDI and an output terminal of the voltage level converting unit 310. The fourth transistor M44 has a drain connected to the power terminal VDDI, and a source and a gate commonly connected to the output terminal of the voltage level converting unit 310.

The operation of the apparatus for generating a power up signal of a semiconductor integrated circuit having the above structure will be described below.

The temperature information output unit 100 detects the temperature outside the semiconductor memory chip and outputs the temperature information T<0:N>.

Referring to FIG. 4, the D/A converter 200 selects at least one of the plurality of resistors R20-1, R20-2, R20-N and converts the power supply voltage VDDI to the output voltage VC obtained by multiplying the power supply voltage VDDI by a division ratio between the selected resistor and the second resistor R30.

When the temperature defined by the temperature information T<0:N> is lower, the D/A converter 200 outputs the increased analog control voltage VC. Meanwhile, when the temperature defined by the temperature information T<0:N> is higher, the D/A converter 200 outputs the decreased analog control voltage VC.

Further, the voltage level converting unit 310 of the power up signal generating unit 300 as shown in FIG. 5, changes the level of the power supply voltage VDDI.

When the output level of the voltage level converting unit 310 is higher than the power supply voltage VDDI, the overvoltage preventing unit 340 discharges the output of the voltage level converting unit 310 to prevent damage to the internal circuit. Thus, the over voltage of the voltage level converting unit 310 is not input to the internal circuit.

In the detecting unit 320, the current flows into the node B through the first transistor M41. The inverter IV41 disables the power up signal PWRUP in a low level, until the output of the voltage level converting unit 310, or the level of the node A becomes equal to or more than a threshold voltage of the second transistor M42.

Thereafter, when the level of the node A becomes equal to or more than the threshold voltage of the second transistor M42, the current supplied through the first transistor M41 is discharged to the ground terminal through the second transistor M42. Accordingly, the inverter IV41 enables the power up signal PWRUP in a high level.

Figure 6:
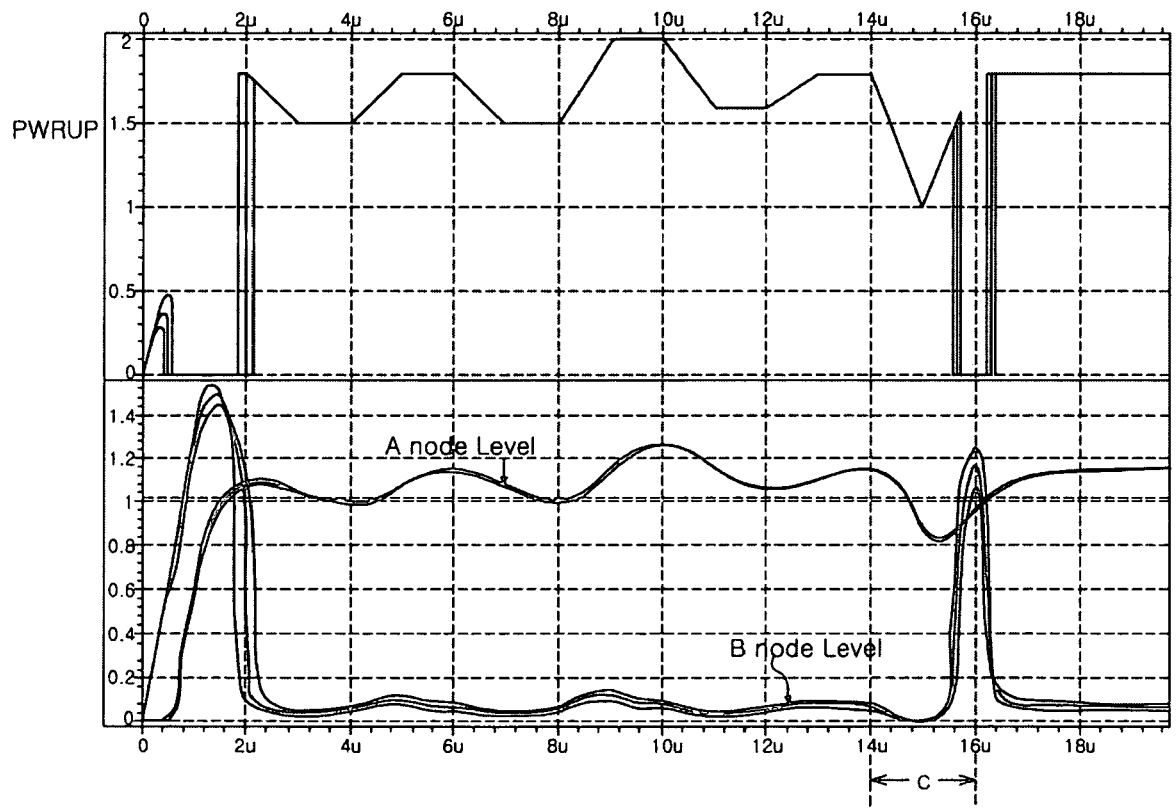
FIG. 6 is a waveform view showing output waveforms of individual parts of the apparatus for generating a power up signal of a semiconductor integrated circuit according to an exemplary embodiment.

Referring to FIG. 6, when a fast power up phenomenon occurs in the period C, in which power rapidly drops at a 1us slope and then rises again and a temperature at that time is high (HOT, for example 90° F.), in the detecting unit 320 of FIG. 5, the current is efficiently supplied to the inverter IV41 by the first transistor M41, such that the logical value of the level of the node B rises to a high level. Therefore, the power up signal PWRUP is disabled in a low level.

Since the level of the analog control voltage VC output from the D/A converter 200 according to the temperature information T<0:N> is low due to the high temperature, the amount of the current to be supplied to the inverter IV41 of the detecting unit 320 through the third transistor M43 of the correcting unit 330 is small.

Further, when the level of the node A is equal to or more than the threshold voltage of the second transistor M42, the current supplied through the first transistor M41 and the correcting unit 330 is discharged to the ground terminal through the second transistor M42, such that the level of the node B becomes low. Therefore, the inverter IV41 enables the power up signal PWRUP in a high level.

Meanwhile, when the fast power up phenomenon occurs and the temperature at that time is low (COLD, for example, 40° F.), since the level of the analog control voltage VC output from the D/A converter 200 according to the temperature information T<0:N> is high due to the low temperature, the current to be supplied to the inverter IV41 of the detecting unit 320 through the third transistor M43 of the correcting unit 330 is substantially increased.

Therefore, even though the first transistor M41 of the detecting unit 320 of FIG. 5 does not supply enough current to the inverter IV41, the correcting unit 330 supplies the current to the inverter IV41 such that the logical value of the level of the node B in the period C of FIG. 6 rises to a high level. Accordingly, the power up signal PWRUP is disabled in a low level.

When the level of the node A is equal to or more than the threshold voltage of the second transistor M42, the current supplied through the first transistor M41 and the correcting unit 330 is discharged to the ground terminal through the second transistor M42, such that the level of the node B becomes low. Therefore, the inverter IV41 enables the power up signal PWRUP in a high level.

The power up signal PWRUP failure is substantially prevented by the above-described method according to the exemplary embodiments.

Further, temperature information supplied from the temperature information output unit 100 may be directly input to the power up signal generating unit 300, without using the D/A converter 200.

Figure 7:
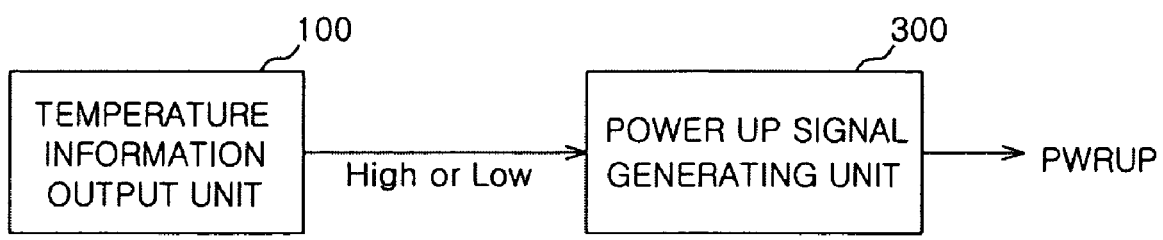
FIG. 7 is a block diagram showing an exemplary apparatus for generating a power up signal of a semiconductor integrated circuit according to another exemplary embodiment.

Referring to FIG. 7, the power up signal generating unit 300 of this embodiment is provided with one bit of the temperature information output from the temperature information output unit 100. The selected bit temperature information may be divided into a low temperature period and a high temperature period. When the current measured temperature is higher than a reference temperature (i.e., room temperature), the temperature information output unit 100 outputs a high level. When the current measured temperature is lower than the reference temperature, the temperature information output unit 100 outputs a low level.

Accordingly, if the current measured temperature is higher than a reference temperature, the third transistor M43 of the correcting unit 330 of FIG. 5 is turned off. The current is not supplied to the inverter IV41 of the detecting unit 320 from the correcting unit 330.

If the current measured temperature is lower than a reference temperature, the third transistor M43 of the correcting unit 330 of FIG. 5 is turned on. The current is supplied to the inverter IV41 of the detecting unit 320 from the correcting unit 330.

Therefore, even though enough current to disable the power up signal PWRUP in a low level is not supplied to the inverter IV41 through the first transistor M41 of the detecting unit 320, an insufficient current is supplemented by the correcting unit 330. Thus, it is possible to disable the power up signal PWRUP in a low level, whereby the semiconductor integrated circuit stably operates.

It will be apparent to those skilled in the art that various modifications and changes may be made without departing from the scope and spirit of the described. Therefore, it should be understood that the above embodiments are not limitative, but illustrative in all embodiments. The scope of the present application is defined by the appended claims rather than by the description preceding them, and therefore all changes and modifications that fall within metes and bounds of the claims, or equivalents of such metes and bounds are therefore intended to be embraced by the claims.

According to the apparatus and method of generating a power up signal of a semiconductor integrated circuit according to one embodiment, an error in the power up signal is prevented from occurring in the low temperature condition. Therefore, the semiconductor memory can normally operate, regardless of the temperature condition, whereby reliability of the semiconductor memory can be substantially improved.

What is claimed is:

1. An apparatus for generating a power up signal for a semiconductor integrated circuit, the apparatus comprising:
   a temperature information providing unit that outputs a control voltage corresponding to a predetermined temperature information; and
   a power up signal generating unit that generates the power up signal based on a level of a power supply voltage, and changes a level of the power up signal according to the control voltages, wherein the power up signal generating unit includes:
   a voltage level converting unit that converts the power supply voltage to a voltage level obtained by multiplying the power supply voltage by a predetermined ratio;
   a detecting unit that detects whether the voltage level of the voltage level converting unit is equal to or more than a set level to generate the power up signal according to a detected result; and a correcting unit that corrects a level of the power up signal according to the control voltage.

2. The apparatus of claim 1, wherein the temperature information providing unit includes:
   a temperature information output unit that outputs a current temperature information indicative of a temperature outside of the semiconductor integrated circuit; and
   a digital-to-analog converting unit that converts the temperature information into the control voltage.

3. The apparatus of claim 2, wherein the digital-to-analog converting unit includes:
   a plurality of transistors having drains, sources connected to a power terminal and gates receiving the temperature information;
   a plurality of first resistors having first ends correspondingly connected to the drains of the plurality of transistors and second ends; and
   a second resistor having a first end commonly connected to the second ends of the plurality of first resistors, and a second end connected to a ground terminal.

4. The apparatus of claim 3, wherein the control voltage is output from a connection node between the first resistors and the second resistor.

5. The apparatus of claim 1, wherein the correcting unit includes:
   a transistor that has a source connected to a power terminal, a gate receiving the control voltage as an input, and a drain connected to a power up signal output path of the detecting unit.

6. The apparatus of claim 1, wherein the voltage level converting unit includes:
   a plurality of resistors connected between a power terminal and a ground terminal.

7. The apparatus of claim 1, wherein the detecting unit includes:
   a first transistor having a drain, a source connected to a power terminal and a gate connected to a ground terminal;
   a second transistor having a drain connected to the drain of the first transistor, a source connected to the ground terminal, and a gate receiving an output of the voltage level converting unit; and
   an inverter having an input terminal connected to the drain of the second transistor.

8. The apparatus of claim 1, wherein the temperature information has at least two bits.

* * * * *